(12) United States Patent
Horn et al.

(10) Patent No.: US 10,177,783 B1
(45) Date of Patent: Jan. 8, 2019

(54) LOSSLESS COMPRESSION OF A CONTENT ITEM USING A NEURAL NETWORK TRAINED ON CONTENT ITEM COHORTS

(71) Applicant: Dropbox, Inc., San Francisco, CA (US)

(72) Inventors: Daniel R. Horn, San Francisco, CA (US); Jongmin Baek, Saratoga, CA (US); Anatoly Yakovenko, San Francisco, CA (US)

(73) Assignee: Dropbox, Inc., San Francisco, CA (US)

( * ) Notice: Subject to any disclaimer, the term of this patent is extended or adjusted under 35 U.S.C. 154(b) by 0 days.

(21) Appl. No.: 15/947,768

(22) Filed: Apr. 6, 2018

Related U.S. Application Data

(63) Continuation of application No. 15/724,265, filed on Oct. 3, 2017, now Pat. No. 9,941,900.

(51) Int. Cl.
| | |
|---|---|
| *H03M 7/00* | (2006.01) |
| *H03M 7/30* | (2006.01) |
| *H03M 7/40* | (2006.01) |
| *G06N 3/04* | (2006.01) |
| *G06N 3/08* | (2006.01) |

(52) U.S. Cl.
CPC ........ *H03M 7/6035* (2013.01); *G06N 3/0472* (2013.01); *G06N 3/08* (2013.01); *H03M 7/4006* (2013.01)

(58) Field of Classification Search
CPC .... H03M 7/6035; H03M 7/4006; H03M 7/30; H03M 7/40; H03M 7/3079; H03M 7/00; G06N 3/0472; G06N 3/08; G06N 3/04
USPC ............................................ 341/51, 50, 107
See application file for complete search history.

(56) References Cited

U.S. PATENT DOCUMENTS

| | | | |
|---|---|---|---|
| 5,583,500 A | 12/1996 | Allen | |
| 6,856,701 B2 | 2/2005 | Karczewicz | |
| 8,473,428 B2 | 6/2013 | Li | |
| 8,868,476 B2 * | 10/2014 | Potkonjak | G06N 5/02 706/21 |
| 8,990,217 B2 * | 3/2015 | Jagmohan | H03M 7/3084 367/14 |
| 9,542,646 B1 * | 1/2017 | Baughman | G06N 3/126 |
| 9,830,315 B1 * | 11/2017 | Xiao | G06F 17/2785 |
| 2007/0214246 A1 * | 9/2007 | Venkataswami | G06Q 10/10 709/223 |

(Continued)

OTHER PUBLICATIONS

Horn, U.S. Appl. No. 15/724,265, filed Oct. 3, 2017, Notice of Allowance, dated Dec. 8, 2017.

(Continued)

*Primary Examiner* — Jean B Jeanglaude
(74) *Attorney, Agent, or Firm* — Hickman Palermo Becker Bingham LLP; Adam C. Stone

(57) ABSTRACT

Lossless compression of a content item using a neural network trained on content item cohorts. A computing system includes a neural network that is used to train a plurality of symbol prediction models. Each symbol prediction model is trained based on a corresponding cohort of content items. A particular symbol prediction model of the models trained is selected based on an intrinsic characteristic of a particular content item to be losslessly compressed such as, for example, the type or file extension of the content item. The content item is then losslessly compressed based on a set of symbol predictions fed to an arithmetic coder that are generated using the particular symbol prediction model selected.

20 Claims, 6 Drawing Sheets

(56) References Cited

U.S. PATENT DOCUMENTS

2007/0233477 A1* 10/2007 Halowani ............... H03M 7/30
  704/232
2008/0050025 A1* 2/2008 Bashyam ................ G06T 9/002
  382/238

OTHER PUBLICATIONS rANS in Practice, The ryg blog, https://fgiesen.wordpress.com/2015/12/21/rans-in-practice/, last viewed on Nov. 27, 2017, 12 pages.

J. Alakuijala et al. "Brotli Compressed Data Format", Internet Engineering Task Force, dated Jul. 2016, 129 pages.

GitHub, "Sherjilozair/char-rnn-tensorflow: Multi-layer Recurrent Neural Networks (LSTM, RNN) for character-level language models", https://github.com/sherjilozair/char-rnn-tensorflow, Nov. 27, 2017, 2pgs.

GitHub, "Multi-layer Recurrent Neural Networks (LSTM, GRU, RNN), for Character-Level Language Models in Torch", https://github.com/karpathy/char-rnn, last viewed on Nov. 27, 2017, 5 pages.

* cited by examiner

LOSSLESS COMPRESSION OF A CONTENT ITEM USING A NEURAL NETWORK TRAINED ON CONTENT ITEM COHORTS

CROSS-REFERENCE TO RELATED APPLICATIONS

The present application is a continuation of U.S. patent application Ser. No. 15/724,265, filed Oct. 3, 2017, the entire content of which is hereby incorporated by reference as if fully set forth herein. The applicant hereby rescinds any disclaimer of claim scope in the parent application or the prosecution history thereof and advise the USPTO that the claims in this application may be broader than any claim in the parent application.

TECHNICAL FIELD

The present disclosure relates to lossless data compression, and more specifically, to computer-implemented techniques for lossless compression of a content item using a neural network trained on content item cohorts.

BACKGROUND

In the last decade, centrally hosted network filesystems with disconnected operation have grown to serve hundreds of millions of users. These services include SugarSync®, Dropbox®, Box®, Google Drive®, Microsoft OneDrive®, and Amazon Cloud Drive®.

Commercially, these systems typically offer users a maximum storage quota in exchange for a flat monthly fee, or no fee at all. Meanwhile, the cost to operate such a system increases with the amount of user data actually stored. These filesystems can rapidly become gargantuan. For example, one of the above-mentioned services currently stores roughly one Exabyte of user data. Therefore, operators of centrally hosted network filesystems benefit from techniques that reduce the net amount of user data stored.

Disclosed implementations can utilize various lossless data compression algorithms as a baseline, such as the Brotli compression algorithm. The Brotli compression algorithm is typically deployed to provide lossless data compression for static content such as Javascript, CSS, HTML, and other static web assets. In some implementations of the present invention, Brotli uses a pre-defined static dictionary derived from a corpus of text documents, such as HTML documents. Use of the dictionary can increase compression where a file repeats common words in the dictionary. Although Brotli provides good baseline lossless data compression for a wide-variety of content, there is a need for general-purpose lossless data compression techniques that can provide further compression savings. Operators of large-scale centrally hosted network filesystems that store large-amounts of user data (e.g., a few petabytes or more) would especially appreciate such techniques.

SUMMARY

Some implementations of the present invention are a general-purpose lossless data compression system that uses a neural network to provide further lossless data compression of an input content item beyond the compression provided by a baseline general-purpose lossless data compression system.

In some implementations of the present invention, for example, the system performs a method that includes compressing an original content item to a baseline lossless compressed data format (e.g., the Brotli format). The system binarizes the baseline lossless compressed data format to a binarized format. The system arithmetically codes the binarized format based on probability estimates from a recurrent neural network probability estimator. The recurrent neural network probability estimator generates probability estimates for current symbols (e.g., binary symbols) of the binarized format to be arithmetically coded based on symbols of the binarized format that have already been arithmetically coded during the arithmetically coding the binarized format.

In some implementations, the recurrent neural network probability estimator comprises a recurrent neural network trained for symbol prediction based on a cohort of content items. The recurrent neural network probability estimator generates probability estimates for the current symbols of the binarized format to be arithmetically coded based on predictions of current symbols generated by the recurrent neural network trained for symbol prediction based on the cohort of content items.

In some implementations, the system uses a recurrent neural network to train a plurality of symbol prediction models (e.g., a set of recurrent neural network weights). Each symbol prediction model is trained based on a corresponding cohort of content items. The system selects a particular symbol prediction model of the plurality of symbol prediction models based on an intrinsic characteristic of the original content item. For example, the intrinsic characteristic may be the content type of the original content item. The recurrent neural network probability estimator generates probability estimates for the current symbols of the binarized format to be arithmetically coded based on predictions of current symbols generated by the recurrent neural network that uses the particular symbol prediction model to generate the predictions.

In some implementations, the system uses a symbol prediction recurrent neural network to train a plurality of symbol prediction models based on a first plurality of content item cohorts. The first plurality of content item cohorts comprise a plurality of content items. The system compresses each content item in the plurality of content items using each symbol prediction model of the plurality of symbol prediction models. The system then trains a cohort predictor recurrent neural network based on results of the compressing each content item in the plurality of content items. After the training the cohort predictor recurrent neural network, the system uses the cohort predictor recurrent neural network to predict a cohort of the first plurality of content item cohorts for each content item in the plurality of content items. The system then forms a second plurality of content item cohorts based on results of the using the cohort predictor recurrent neural network. The second plurality of content item cohorts comprises the plurality of content items. The system then uses the symbol prediction recurrent neural network to update the plurality of symbol prediction models based on the second plurality of content item cohorts resulting in a plurality of updated symbol prediction models.

In some implementations, the system selects a particular updated symbol prediction model of the plurality of updated symbol prediction models based on an intrinsic characteristic of the original content item. The recurrent neural network probability estimator generates probability estimates for the current symbols of the binarized format to be arithmetically coded based on predictions of current symbols generated by the symbol prediction recurrent neural network that uses the particular updated symbol prediction model to generate the predictions.

In some implementations, the system uses the cohort predictor recurrent neural network to predict a particular cohort of the second plurality of content item cohorts for the original content item. Based on the results of using the cohort predictor recurrent neural network to predict the particular cohort for the original content item, the system selects a particular updated symbol prediction model of the plurality of updated symbol prediction models. The recurrent neural network probability estimator generates probability estimates for the current symbols of the binarized format to be arithmetically coded based on predictions of current symbols generated by the symbol prediction recurrent neural network that uses the particular updated symbol prediction model to generate the predictions.

While in some implementations a recurrent neural network is used to generate probability estimates for current symbols, another type of neural network or predictor is used in other implementations. For example, a long short-term memory recurrent neural network, a perception, hidden Markov model, or a statistical bin technique may be used to generate the probability estimates.

DETAILED DESCRIPTION

Reference will now be made in detail to implementations, examples of which are illustrated in the accompanying drawings. In the following detailed description, numerous specific details are set forth in order to provide a thorough understanding of the implementations. However, it will be apparent to one of ordinary skill in the art that the implementations may be practiced without these specific details.

System Overview

Figure 1:
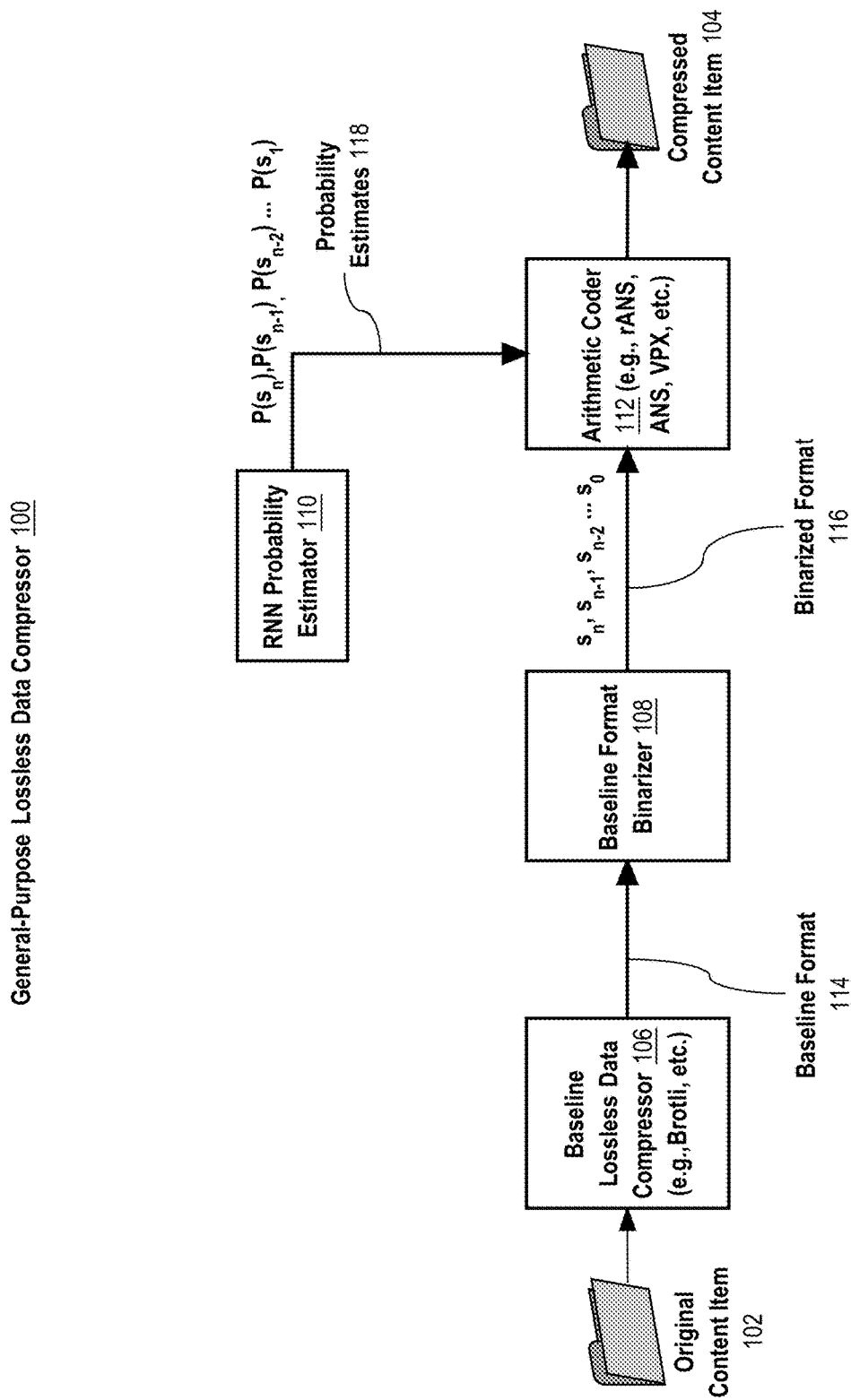
FIG. 1 is a block diagram that illustrates major components of a general-purpose lossless data compression system that uses a recurrent neural network to provide further lossless data compression of an input content item beyond the compression provided by a baseline general-purpose lossless data compression system, according to some implementations of the present invention.

FIG. 1 is a block diagram that illustrates major components of a general-purpose lossless data compression system 100 (hereinafter "compressor 100") that uses a recurrent neural network (hereinafter "RNN") to further compress an original content item 102 in a lossless manner. The original content item 102 is further compressed by compressor 100 to produce further compressed content item 104. More specifically, the compressor 100 further compresses the original content item 102 relative to a baseline level of compression of the original content item 102 provided by a baseline lossless data compressor 106 (hereinafter "baseline compressor 106").

At a high level, to produce the further compressed content item 104, the compressor 100 uses the baseline compressor 106, a baseline format binarizer 108 (hereinafter "binarizer 108"), a recurrent neural network probability estimator 110 (hereinafter "RNN estimator 110"), and an arithmetic coder 112. The various functional blocks 106, 108, 110, and 112 shown may be implemented entirely in software, entirely in hardware, or using a combination of hardware and software.

In operation of compressor 100, the original content item 102 is compressed to produce the further compressed content item 104. The original content item 102 may have an arbitrary data format. In other words, no particular data format of the original content item 102 is required. In some implementations of the present invention, the original content item 102 has a data format that is not a general-purpose data compression format. For example, the original content item 102 may be an uncompressed word processing document, presentation document, spreadsheet document, executable (binary), shared library (e.g., a dynamic link library), text document, or other data that has not been compressed using a general-purpose lossless data compressor (e.g., ZIP).

Preferably, the further compressed content item 104 produced by the compressor 100 is smaller in size than the original content item 102 in terms of number of storage bytes required to store the further compressed content item 104 in storage media. Also, the further compressed content item 104 is preferably lossless with respect to the original content item 102. That is, the original content item 102 can be recovered bit-for-bit from the further compressed content item 104 by performing essentially the inverse of the compression operations applied to the original content item 102 by the compressor 100.

As used herein, the term "content item" is not intended to imply any particular data container for storing or transmitting the content item. A content item (e.g., original content item 102 or further compressed content item 104) may be stored in storage media in a filesystem file, in one or more data blocks, in one or more database rows, or in another type of data container. A content item may be transmitted over a data network in one or more data packets. Further, the same content item may be stored in different types of data containers. For example, a content item may be stored at centrally hosted network filesystem in one or more data blocks. The one or more data blocks may be transmitted over a data network to an end-user computing device in one or more data packets. The end-user computing device may then assemble the one or more data blocks received in the one or more data packets and store the assembled data block(s) in a filesystem file at the end-user computing device.

In some implementations of the present invention, a centrally hosted network filesystem uses compressor 100 to convert the original content item 102 provided by a user of the filesystem to the further compressed content item 104. The centrally hosted network filesystem stores the further compressed content item 104 in storage media in lieu of storing the original content item 102 in the storage media. By doing so, data storage resources of the storage media are conserved. When the original content item 102 is requested by the user or the original content item 112 is otherwise needed, the centrally hosted network filesystem uses a data decompressor that implements essentially the inverse of the operations implemented by the compressor 100 to re-obtain the original content item 102 from the further compressed content item 104.

The compressor 100 uses the baseline compressor 106 to provide a baseline level of lossless data compression of the original content item 102. The baseline compressor 106 may be a general-purpose lossless data compressor with a known lossless data compression format, such as Brotli, LZ1, LZ2, or the like. The baseline compressor 106 compresses the original content item 102 to convert the original content item 102 to a known baseline lossless compressed data format 114, referred to hereinafter as the "baseline format 114." The baseline format 114 provides a baseline level of lossless data compression for the original content item 102 and converts the arbitrary data format of the original content item 102 into a known lossless data compression format (e.g., Brotli format).

The compressor 100 inputs the baseline format 114 of the original content item 102 to the binarizer 108 to provide a fixed lossless encoding (i.e., binarized format 116) of the baseline format 114. The symbols $S_0 \ldots S_{n-3}, S_{n-2}, S_{n-1}, S_n$ of the binarized format 116 are then arithmetically coded by the arithmetic coder 112 based on probability estimates 118 fed to the arithmetic coder 108 from the RNN probability estimator 110. Here, n is the total number of symbols of the binarized format 116 that is arithmetically coded by the arithmetic coder 112. The current symbol of the binarized format 116 being arithmetically coded by the arithmetic coder 112 is referred to herein as $S_k$ where $0<=k<=n$.

In some implementations of the present invention, the current symbol $S_k$ input to the arithmetic coder 112 for coding is a single bit of the binarized format 116. Thus, in these implementations, the current symbol $S_k$ is a binary symbol having a 0 (FALSE) value or a 1 (TRUE) value. While in some implementations, the current symbol $S_k$ input to the arithmetic coder 112 is a single bit, the current symbol $S_k$ input to the arithmetic coder 112 is a multi-bit value of the binarized format 116. For example, the current symbol $S_k$ can be a nibble (i.e., a 4-bit value) or a byte (i.e., an 8-bit value). It should be noted that different bit-sized symbols may be input to the arithmetic coder 112 during coding of an original content item 102. For example, some of the symbols input to the arithmetic coder 112 may be single bit values while other symbols may be multi-bit values. While different bit-sized symbols may be used, all symbols $S_0 \ldots S_{n-3}, S_{n-2}, S_{n-1}, S_n$ input to the arithmetic coder 112 may be of the same bit size. For example, all symbols $S_0 \ldots S_{n-3}, S_{n-2}, S_{n-1}, S_n$ may be binary, nibble, or bytes values. Use of multi-bit symbols may be employed for computational efficiency (e.g., to leverage relatively computational efficient bit shifting operations). Using multi-bit symbols also reduces the number of probability estimates that need to be generated by the RNN estimator 110 (and hence speeds up the encoding/decoding process) because a single probability estimate can be generated for a multi-bit symbol.

The arithmetic coder 112 maintains a range on the interval of [0, 1). The arithmetic coder 112 may be viewed as a state machine where the initial range is the initial state, each range after the initial range to the penultimate range is an intermediate state, and the final range is the final state. The symbols $S_0 \ldots S_{n-3}, S_{n-2}, S_{n-1}, S_n$ of the binarized format 116 determines the final range. Each intermediate range and the final range may be computed recursively by the arithmetic coder 112 for the symbols $S_1 \ldots S_{n-3}, S_{n-2}, S_{n-1}, S_n$. And each intermediate range and the final range is based on a probability estimate generated by the RNN estimator 110. The probability estimate for the first symbol $S_0$ and the initial range may be predetermined (e.g., predefined) in the compressor 100 so that an arithmetic decoder corresponding to the arithmetic coder 112 can decode the first symbol $S_0$ using the same predetermined probability estimate. The range is then updated for each subsequent probability estimate 118 until all the remaining symbols $S_1 \ldots S_{n-3}, S_{n-2}, S_{n-1}, S_n$ are arithmetically coded by the arithmetic coder 112. At the end, after the final symbol $S_n$ is arithmetically coded by the arithmetic coder 112, the final range on the interval of [0, 1) is encoded in the further compressed content item 104. Decoding involves essentially the inverse of coding, given the probability estimates 118.

Each probability estimate 118 is an estimate of the conditional probability distribution of the current symbol $S_k$ to be arithmetically coded by the arithmetic coder 112. In particular, the estimate of the probability distribution is conditional on a current coding context of the current symbol where the current coding context may depend the prior coding contexts of previously coded symbols (e.g., the prior coding contexts of symbols $S_{k-1}, S_{k-2}, S_{k-3}$, etc.). Various different approaches that the RNN estimator 110 may use to determine the current coding context for the current symbol $S_k$ are described in greater detail below.

In this case where the current symbol $S_k$ is a single bit, a probability estimate may be either an estimate of the current symbol $S_k$ being TRUE (1) or an estimate of the current symbol $S_K$ being FALSE (0). However, the estimate can also be a probability distribution that includes both an estimate of the current symbol $S_k$ being TRUE (1) and an estimate of the current symbol $S_K$ being FALSE (0). Where the current symbol $S_k$ is a multi-bit symbol, the estimate may be a probability distribution of all possible values of the current symbol $S_k$. For example, where the current symbol $S_K$ is a nibble, then the estimate may be a probability distribution of all possible sixteen values (0-15). Similarly, for a byte, then the estimate may be probability distribution of all possible two hundred and fifty-six (256) values (0-255).

In some implementations of the present invention, the arithmetic coder 112 is a conventional binary arithmetic coder such as a range asymmetric numeral system (rANS) arithmetic coder, an asymmetric numeral system (ANS) arithmetic coder, a binary range arithmetic coder (e.g., VPx), or other like binary arithmetic coder.

Baseline Format

In some implementations, the baseline format 114 is a series or sequence of commands that conform to a known lossless compressed data format. For example, the series or sequence of commands may conform to those defined in the Brotli compressed data format specification. The Brotli specification is available on the Internet at /rfc/rfc7932.txt in the ietf.org domain, the entire contents of which is hereby incorporated by reference.

There are three general types of Brotli commands that can appear in the baseline format 114, according to some implementations. The three general types of commands: Literals, Dictionary, and Copy. To aid in understanding the example binarized format 116 described below, each of these three types of commands will now be described in greater detail with respect to how the commands are used when decompressing the baseline format 114 to reproduce the original content item 102. When decompressing, the baseline format 114 may be consumed (e.g., by a Brotli decompressor) as an "input" data stream and the produced as an "output" data stream for insertion into the reproduction of the original content item 102.

A Literal command is for a portion input data stream that is to be inserted "in the raw" in the output data stream. For example, the portion may be consecutive bits or bytes in the input data stream. Typically, a Literal command is used for a portion that does not appear previously in the input data stream, or the distance to the immediately prior appearance of the portion in the input data stream is more than a threshold distance. Here, "distance" refers to the number of bits or bytes (or other bit or byte-based unit) between two consecutive occurrences of the portion in the input data stream. For purposes of this disclosure, the distance measurement can be relative to the any part (e.g., beginning, middle, or end) of the consecutive portion occurrences.

A Dictionary command in the input data stream signals a lookup of a word in a dictionary and insertion of the word in the output data stream. Three parameters typically accompany a Dictionary command in the input stream. One parameter is a "word length" parameter between 4 and 24 bits in length in the input data stream. The word length parameter specifies the length of the word to insert into the output data stream. Another parameter is a "sub-index" parameter. The sub-index parameter is used as a key to lookup the word in the dictionary. The sub-index parameter is a value in the input data stream from 0 to 2 to the power of the word length (i.e., 0 to 2^(word length)). Another parameter is a "transformation" parameter. The transformation parameter is a 7-bit value in the input data stream. The 7-bit value specifies a transformation to be applied to the word from the dictionary. The transformed word is then inserted into the output data stream instead of the word from the dictionary. For example, a transformation may specify that the word from the dictionary be capitalized, truncated, padded before and/or after with white space, preceded and/or followed with a comma or other punctuation, etc. before being inserted into the output data stream A Copy command pulls bytes from one or more portions previously output to the output data stream for output again at the current output position of the output data stream. The distance in the output data stream that a Copy command will pull bytes from may be limited by a window size. The window size effectively determines how much of the output data stream needs to be buffered in memory to be available for pulling bytes from.

It should be noted that the Brotli format is an example of one possible baseline compressed data format for the baseline format 114. However, the baseline format 114 is not limited to Brotli or any particular lossless compressed data format. Virtually any lossless compressed data format that conforms to a known lossless compressed data format specification may be used as the baseline format 114. For example, other lossless dictionary coders or lossless substitute coders may be used to generate the baseline format 114, such as LZ77 or LZ78.

Binarization

In some implementations, the binarizer 108 converts the baseline format 114 into a binarized format 116. For example, the binarized format 116 may binarize the baseline format 114 where the baseline format 114 conforms to the Brotli format discussed above. In this case, the binarizer 108 may use a fixed encoding for each Brotli command instance that occurs in baseline format 114. The binarized format 114 is then encoded by arithmetic coder 112 using the probability estimates 118 generated by the RNN estimator 110.

For each Brotli command in the baseline format 114, a series of bits is included in the binarized format 114. A first bit in the series for the command selects between (a) a Copy command and (b) a Literal or Dictionary command, depending on the type of the command. If the first bit does not select a Copy command, then the second bit in the series selects between (b1) a Literal or (b2) a Dictionary command. If the second bit elects (b2) a Dictionary command, then the third bit in the series can be an end-of-file (EOF) bit that signals the end of the binarized format 114. Otherwise, the third bit in the series is the first bit of a Dictionary command encoding as described below. If the second bit in the series selects (b1) a Literal command, then the third bit in the series is the first bit of a Literal command encoding as described below. If the first bit in the series selects (a) a Copy command, then the second bit in the series is the first bit of a Copy command encoding as described below.

A Literal command of the baseline format 114 may be encoded in the binarized format 116 as follows:

The number of bits needed to encode the number of literals is encoded using a nibble (e.g., 4 consecutive bits) to represent a number between 0 and 14 inclusive. If the value of this nibble is 15, then the number of literals lies between 15 and 24 and is encoded using a subsequent nibble.

The number of literals is encoded using a number of nibbles equal to (X minus 1) divided by 4 (round up) where X is the number of bits needed to encode the number of literals.

The actual string of data is encoded using a number of nibbles equal to (2 times X) where X is the number of literals.

A Dictionary command of the baseline format 114 may be encoded in the binarized format 116 as follows:

A first nibble selects a word length between 4 and 18 inclusive. If the first nibble value is 15, then the word length is between 19 and 24 inclusive. In this case, a second nibble is required to encode the word length.

The index into the dictionary is encoded as a number of bits between 0 and 2 to the power of word length.

The value of the index is encoded as a number of nibbles equal to 2 to the power of (word length minus 2).

The transform is encoded with two additional nibbles that select a numbered transform between 0 and 128.

A Copy command of the baseline format 114 may be encoded in the binarized format 116 as follows:

The number of bits required to represent the distance prior in the Copy command is represented as a 1-indexed nibble that selects a distance length between 1 and 15 inclusive. If the distance is more than 2 to the power of 15, then all bits in the 1-indexed nibble will be one and the distance length will be encoded with a subsequent 1-indexed nibble selecting a distance length between 16 and 24 inclusive.

The actual prior distance is encoded with a number of nibbles sufficient to represent the distance in binary, as with the length of the literal insertions.

The number of bits required to represent the number of bytes to copy from the prior distance is encoded as a nibble that selects a distance length between 0 and 14 inclusive. If that nibble is all ones, then an addition nibble is used to represent the bit-length of the value of the number of bytes to copy which is between 15 and 25.

The number of bytes to copy from the prior distance is encoded with a sufficient number nibbles to represent the number.

The above-described binarized format is an example of one possible binarized format of the baseline format 114.

Other binarized formats may be used. The particular binarized format used may vary from implementation to implementation depending on the requirements of the particular implementation at hand including the particular characteristics of the baseline format 114 that is used to provide the baseline compression of the original content item 102.

Functional Overview

Figure 2:
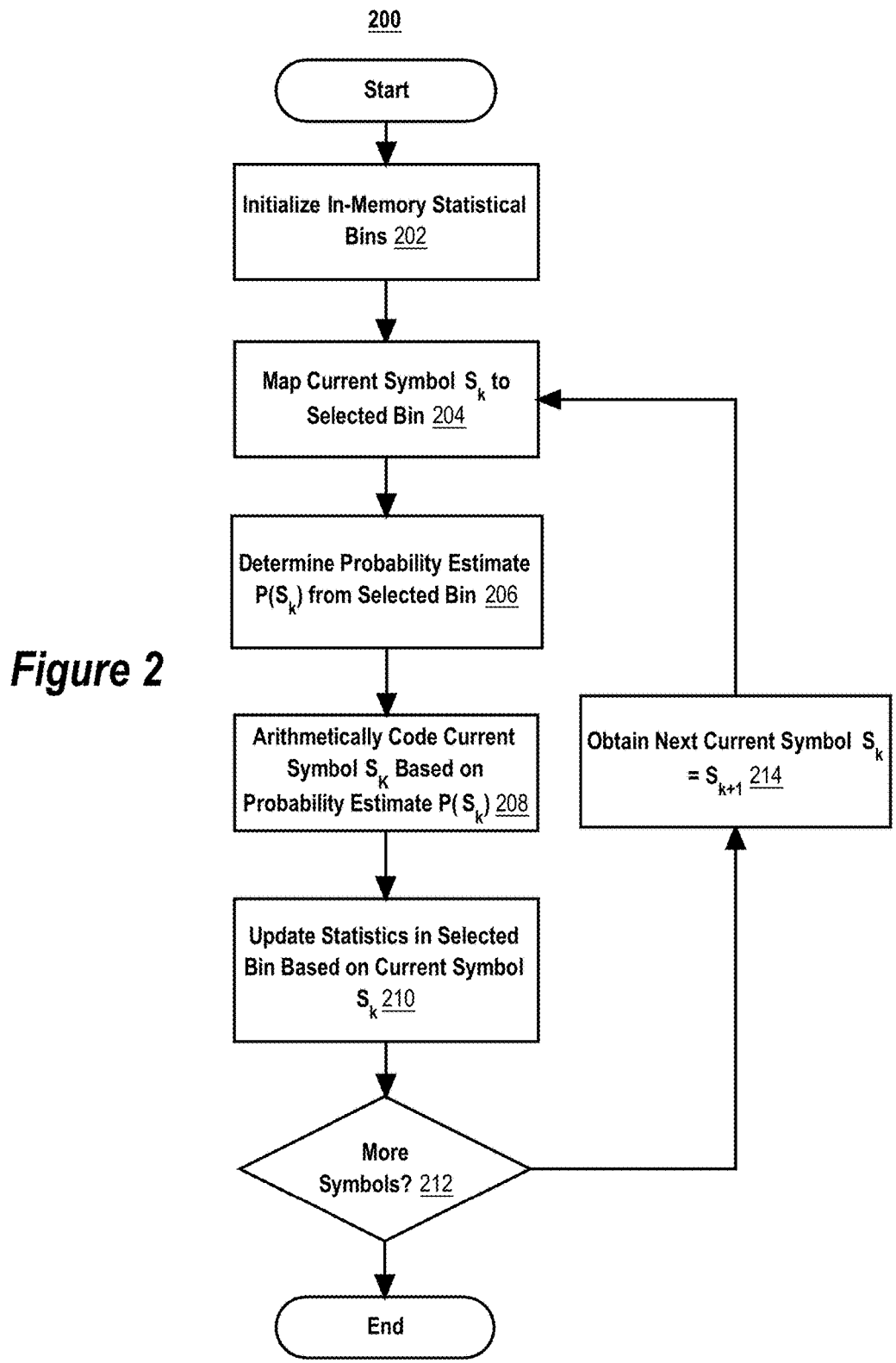
FIG. 2 is a flowchart of a process for general-purpose lossless data compression using a recurrent neural network, according to some implementations of the present invention.

FIG. 2 is a flowchart of a process 200 for general-purpose lossless data compression using a recurrent neural network, according to some implementations of the present invention. The process 200 may be performed by compressor 100 in the context of compressing an original content item 102 to a further compressed content item 104, for example. In some implementations, the process 200 is performed by a computing system comprising one or more processors and storage media. The storage media stores one or more programs executed by the one or more processors to perform the process 200. The one or more programs include executable instructions for performing various operations, including operations At operation 202, before the first symbol $S_0$ of the binarized format 116 is arithmetically coded by the arithmetic coder 112, a table of statistical bins is initialized with initial statistics. For example, each of the bins may be initialized with predetermined statistics. For example, the predetermined statistics may reflect equal probability for each of the possible symbols. For example, the predetermined statistics may reflect equal probability of a 1 (TRUE) symbol and 0 (FALSE) symbol.

Preferably, the table is stored in-memory for efficient read and write access. Here, in-memory refers generally to volatile memory, as opposed to non-volatile memory. However, portions or all of the table may be paged to (temporarily stored in) non-volatile memory to make room in the volatile memory for other data. The portions or the table may be read back into volatile memory when needed. In this case, the table is still considered to be stored "in-memory," despite the fact that some or all of the table may be temporarily stored in non-volatile memory at any given time.

Each statistical bin of the table represents a corresponding coding context. When coding, the current symbol $S_k$ is mapped (Operation 204) to one of the bins in the table based on the current coding context which may depend on the prior coding contexts of previously coded symbols (e.g., the prior coding contexts of symbols $S_{k-1}$, $S_{k-2}$, $S_{k-3}$, etc.). The current statistics in mapped bin are used to determine (Operation 206) the probability estimate $P(S_k)$ for the current symbol $S_k$. The current symbol $S_k$ is then arithmetically coded (Operation 208) based on the probability estimate for the current symbol $P(S_k)$ output by the RNN estimator 110. The statistics in the selected bin are also updated (Operation 210) based on the actual symbol observed $S_k$. The process 200 continues as long as there are more symbols to code (Operation 212). After all symbols have been coded (Operation 210), the process 200 ends.

In some implementations, output of a RNN of the RNN estimator 110 is used to select a statistical bin for the current symbol $S_k$. The output of the RNN may be a prediction based on previously coded symbols (e.g., the prior coding contexts of symbols $S_{k-1}$, $S_{k-2}$, $S_{k-3}$, etc.). The RNN may operate over sequences of vectors including input vectors, state vectors, and output vectors. There may be no limit on the length of the input vectors. The RNN may combine the input vectors with the state vectors using a fixed, learned function to produce new state vectors.

At a high-level, the RNN of the RNN estimator 110 may operate by accepting an input vector and producing an output vector. The output vector is based on the input vector and a history of prior input vectors. The RNN may maintain internal state in the form of state vector(s) that is/are updated for each step where an input vector is input to each step.

The RNN of the RNN estimator 110 may also be layered. In this case, there are multiple RNNs stacked on top of each other. The output vector from a RNN layered higher in the stack is provided as the input vector to the RNN layered just below in the stack.

In some implementations, the RNN of the RNN estimator 110 is a multi-layer RNN trained by back propagation to predict the current symbol $S_k$ given one or more previously coded symbols $S_{k-1}$, $S_{k-2}$, $S_{k-3}$, etc. as input. The RNN estimator 110 uses the prediction to select a statistical bin. However, the RNN estimator 110 may instead use the prediction directly to compute a probability estimate $P(S_k)$ for the current symbol $S_k$. The multi-layer RNN may be trained in multiple passes prior to coding the original content item 102. Alternatively, the multi-layer RNN may be trained in a single pass.

In some implementations, the RNN of the RNN estimator 110 combines (mixes) input predictions of the current symbol $S_k$ to generate an overall prediction of the current symbol $S_k$. The input predictions may be generated based on other models such as one or more statistical models and/or one or more other RNNs. In this case, the RNN of the RNN estimator 110 may compute the overall prediction as a weighted average of probabilities in the logistic domain. After the current symbol $S_k$ is arithmetically coded, weights applied to the other models are updated based on the accuracy of the respective predictions to favor the models that produced the more accurate predictions. For example, the weights may be updated based on the extent of the error in the prediction.

Various techniques may be combined to generate the probability estimates 118. For example, the probability estimate output from a statistical bin technique may be combined with symbol prediction output by a RNN symbol predictor. The two outputs may be combined as a weighted average. In this case, the weights of the average may be determined a neural network based on the relative errors between the statistical bin technique and the RNN symbol predictor technique in predicting symbols. Alternatively, the two outputs may be combined simply as a pure average.

In some implementations, a two-dimensional "grid" of statistical bins is stored in-memory. The grid has an "x-axis" representing a first probability estimate and a "y-axis" representing a confidence in the first probability estimate for the current symbol $S_k$. To determine the confidence in the first probability estimate, the difference between the first probability estimate and a second probability estimate for the current symbol $S_k$ is determined. Various different techniques such as a statistical bin technique and/or a RNN symbol predictor technique may be used to generate the first and second probability estimates. The middle row of statistical bins along the y-axis may represent a high confidence where the first and second probability estimates agree. Rows of bins below the middle row may represent a negative confidence where the magnitude difference between the first probability estimate and the second probability estimate is negative and rows of bins above the above the middle row may represent a positive confidence where the magnitude difference between the first probability estimate and the second probability estimate is positive. A magnitude difference between first and second probability estimates is used to select a row of bins in the grid. The first probability estimate is used to select a column of bins in the grid. The bin at the intersection of the selected row and columns is then used to generate the final probability estimate for the current symbol $S_k$. The final probability estimate is passed to the arithmetic coder 112 for coding the current symbol $S_k$. In this way, a final probability estimate may be generated that is a function of the first and a confidence in the first probability estimate. For example, where the first and second probability estimates agree (i.e., there is high-confidence), the statistical bin in the middle row may use the first probability estimate as the final probability estimate. On the other hand, the initial probability estimate may be adjusted by a selected bin based on the magnitude difference between the first and second probability estimates.

RNN Probability Estimator

Figure 3:
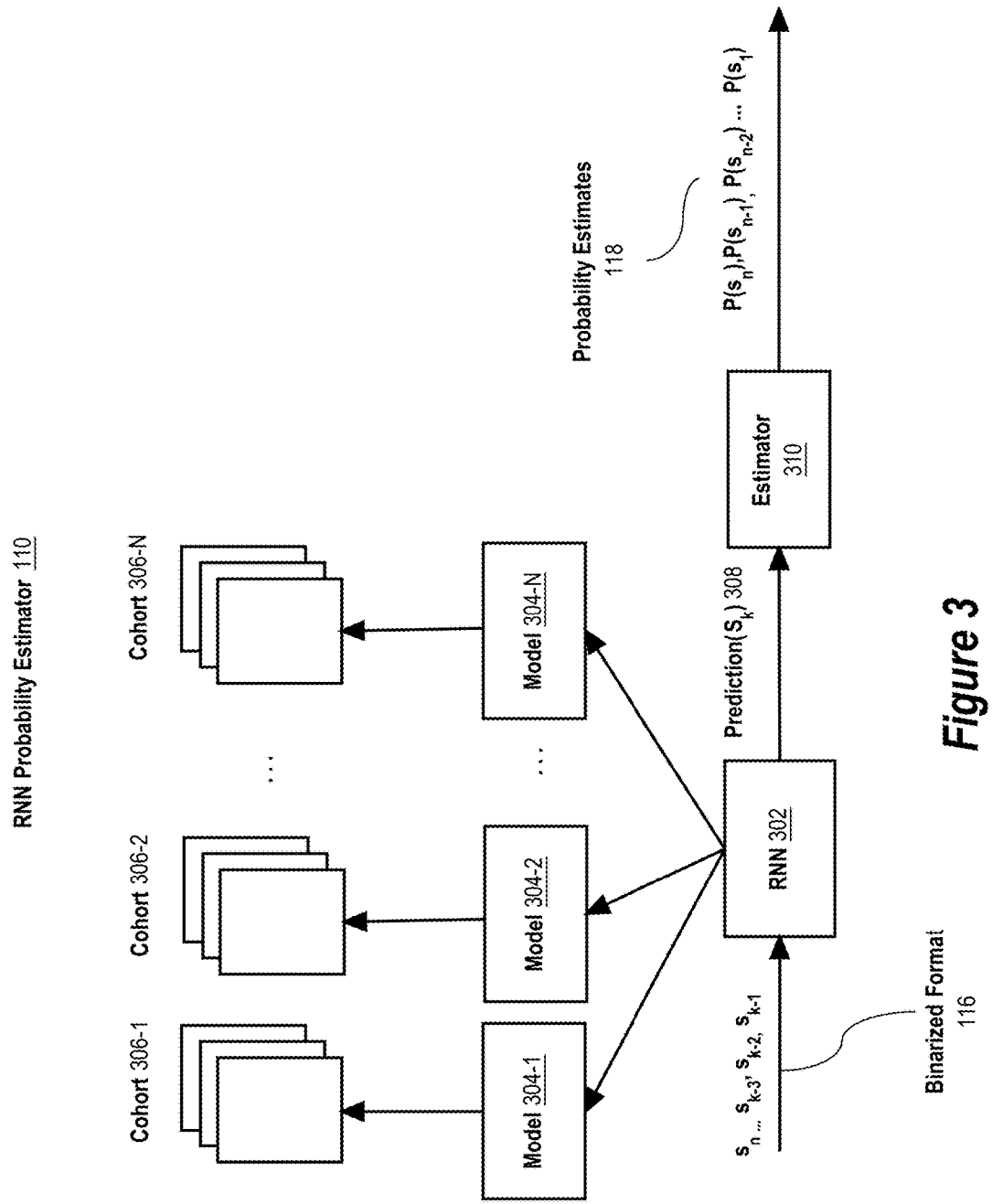
FIG. 3 is a block diagram that illustrates a recurrent neural network-based probability estimator, according to some implementations of the present invention.

FIG. 3 is a block diagram of the RNN probability estimator 110, according to some implementations of the present invention. A "symbol-predictor" RNN 302 trains multiple models 304-1, 304-2 . . . 304-N based on the multiple corresponding content item cohorts 306-1, 306-2 . . . 306-N. Each of the models 304-1, 304-2 . . . 304-N is trained for symbol prediction based on the corresponding cohort 306. For example, model 304-1 is trained for symbol prediction based on cohort 306-1, model 304-2 is trained for symbol prediction based on cohort 306-2, and so on.

Each cohort 306 can be composed of like content items. For example, each cohort 306 may be composed of content items of the same general content type. For example, cohort 306-1 may be composed of binary executable content items, cohort 306-2 composed of text content items, etc. Cohorts may be composed in a variety of different ways and no particular composition is required. For example, a cohort 306 may be composed of specific types of content items such as text content items of Shakespeare sonnets. By training different models 304 for specific cohorts 306, the models 304 are better tuned for predicting symbols for content items that are like the corresponding cohort 306.

In some implementations, when the compressor 100 is compressing a given original content item 102, a model 304 may be selected for symbol prediction based on which cohort 306 the given content item 102 is most closely aligned with. For example, the compressor 100 may determine a type of the given content item 102. The determined type may then be used to select a model 304 that is trained based on a cohort 306 for that determined type. For example, if the determined type of the given content item 102 is executable binary, then a model 304 that is trained based on a cohort 306 of executable binary content items may be selected. Similarly, if the determined type of the given content item 102 is Shakespeare sonnet, then a model 304 that is trained based on a cohort 306 of Shakespeare sonnets may be selected.

In some implementations, a "cohort predictor" RNN is trained to predict the best cohort 306 to which the given content item 102 belongs. To train the cohort predictor RNN, different content items may be compressed by the compressor 100 using multiple of the models 304. Each of the models 304 may be trained based on the cohorts 306. For example, each of the models 304 may be trained on a corresponding cohort 306 composed of content items of like or same type (e.g., a cohort 306 of executable binaries). Each content item is compressed using all of the models 304. Based on how well each model 304 compresses the content item as a function of the reduction in size of the original content item 102 to the further compressed content item 104, the cohort predictor RNN is trained to predict a cohort for a given content item. At this point, the original cohorts 306 can be discarded and new cohorts formed based on the range of predictions produced by the trained cohort predictor RNN for a range of content items. This training process may be repeated as often as desired until a properly tuned cohort prediction model is built.

Figure 4:
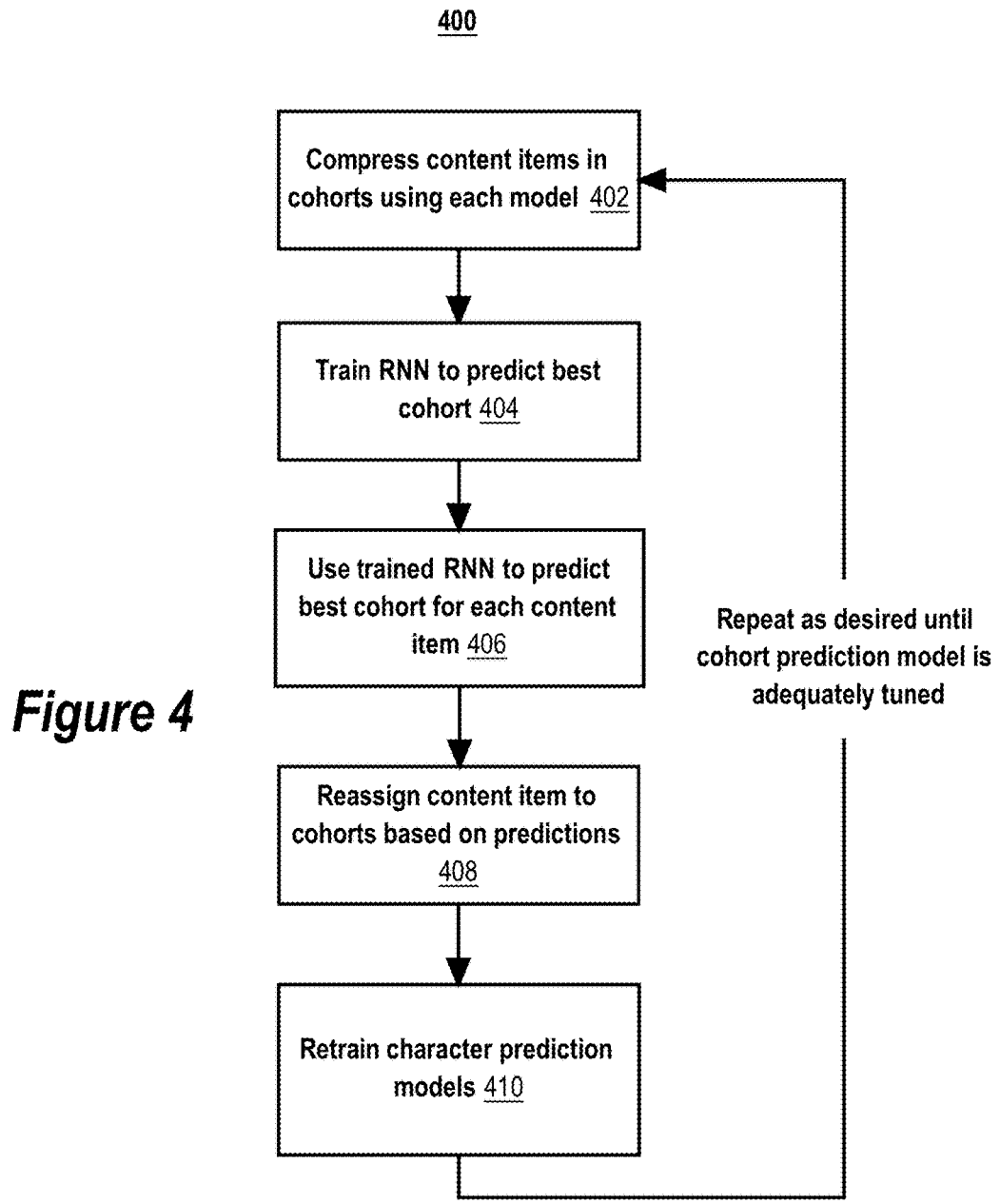
FIG. 4 is a flowchart of a process for training a cohort predictor recurrent neural network, according to some implementations of the present invention.

Turning briefly to FIG. 4, it is a flowchart 400 of a process for training a cohort predictor model, according to some implementations of the present invention. The process 400 starts with an initial set of symbol prediction models such as models 304 and an initial set of content item cohorts such as cohorts 306.

At operation 402, the content items in the initial set of cohorts are each compressed by the compressor 100 using each symbol prediction model in the initial set of symbol prediction models.

At operation 404, the cohort predictor RNN is trained to predict the best cohort in the initial set of cohorts for each of the content items based on the results of the compressing in operation 402. For example, weights of the cohort predictor RNN may be adjusted to favor the symbol prediction model that provides the greatest compression for the content item.

At operation 406, after the cohort predictor RNN is trained, the trained RNN is used to predict the best cohort for each content item. It may be the case that the predicted cohort for a given content item may be different than the cohort to which the given content item is initially assigned. In other cases, the cohort predictor RNN may predict, as the best cohort for a given content item, the same cohort to which the given content item is initially assigned.

At operation 408, the content items are reassigned to the cohorts based the predictions for the content items in operation 406. For example, if the trained RNN predicts a different cohort for a given content item other than the cohort to which the given content item is currently assigned, then the given content item is assigned to the predicted cohort and no longer assigned to the initial cohort. This assignment of content items results in a revised set of cohorts.

At operation 410, a revised set of symbol prediction models is generated by the symbol prediction RNN 302 based on the revised set of cohorts. For example, a new revised symbol model may be trained for each cohort in the revised set of cohorts.

Operations 404, 406, 408, and 410 may be repeated as often as desired until a satisfactorily trained cohort predictor model is trained. In each iteration of operations 404, 406, 408, and 410, the revised set of symbol prediction models and the revised set of cohorts resulting from the prior iteration of the operations may serve as the initial set of models and initial set of cohorts for the next iteration. The training of the cohort predictor model is carried across iterations.

Returning now to FIG. 3, once a symbol prediction model has been selected for a given original content item 102, either based on intrinsic characteristics of the given content item (e.g., the type of the content item, the file extension associated with the content item, etc.) or based on a prediction from a cohort prediction RNN, the given content item is compressed using the selected symbol prediction model. In doing so, the symbol prediction RNN 302 may use the selected model to predict 308 each current symbol $S_k$ (e.g., a byte or symbol prediction) of the binarized format 116 to be arithmetically coded. The prediction 308 may be based on previously arithmetically coded symbols ($S_{k-1}$, $S_{k-2}$, $S_{k-3}$, etc.). The predictions 308 are input to an estimator 310 which produces the probability estimates 118 based on the predictions 308. In some implementations, the estimator 310 uses the predictions 308 to select a statistical bin for the current symbol $S_k$. The estimator 310 then generates the probability estimate for the current symbol $S_k$ based on the then current statistics in the selected bin. In some embodiments, the estimator uses the predictions 308 directly to generate the probability estimate for the current symbol $S_k$ without selecting a bin.

Probability Bin Updating

In some implementations, process 200 includes a pluggable probability bin updating algorithm for retrospectively updating the statistics of the selected statistical bin based on the most recently coded symbol.

In some implementations, each selected statistical bin tracks the actual symbols observed when the statistical bin is selected. This tracking is used to generate a probability estimate for the arithmetic coder when the bin is selected. For example, each bin can count the number of times the bin is selected so far in the encode/decode and a count of the number of a times a "false" bit (or "true" bit) is observed so far in the encode/decode when the bin is selected. Assuming a 1-valued bit is "true" and a 0-valued bit is "false," then the probability estimate for a selected statistical bin may be generated as the sum of the count of the number of true bits observed so far in the encode/decode when the statistical bin is selected divided by sum of the count of all bits observed so far in the encode/decode when the statistical bin is selected, or the count of true bits observed so far when the bin is selected divided by the count of true and false bits observed so far when the bin is selected.

It should be noted that the counts maintained in the statistical bins may be maintained such that the counts are always equal to a power of 2 so that the division operation for calculating the probability estimate can be implemented as an efficient bit shift operation.

In some implementations, each statistical bin stores a weighted average between the current cumulative distribution function of all probabilities and a spike around the observed symbol.

In some implementations, a neural network is trained to update selected statistical bins based on the observed symbol. For example, the neural network may be trained to update selected statistical bins based on the type of Brotli command (e.g., Copy, Literal, or Dictionary) that the observed symbol is an encoding of.

In some implementations, the neural network is trained to find optimal update rates for each type of Brotli command. This training may additional depend on the type of the original content item. The update rate may be serialized out to the further compressed content item for use during decompression. For example, the serialized update rate may be stored in a header of the further compressed content item.

Statistical Bin Selection

Various different techniques and criteria may be used to select a statistical bin for generating a probability estimate for a current symbol to be arithmetically coded.

In some implementations, each statistical bin is associated with a bin index. The bin index may be a numerical value that functions as an address of a corresponding bin, for example. In this case, the two or three prior symbols or two or three prior sets of symbols of the binarized format that were arithmetically coded can be used to select a statistical bin by its associated bin index. For example, for the symbols of the binarized format that encodes a Brotli Literal command of the baseline format, a bin index of a statistical bin may be selected to arithmetically code each of the symbols based on the values of the immediately prior two or three nibbles of the binarized format that were just arithmetically coded. It should be noted that this technique does not require a recurrent neural network.

In some implementations, each Brotli Literal command encoded in the binarized format is mapped to a value in a predetermined range, such as 0 and 4. The mapped value is then used to select a corresponding statistical bin for generating probability estimates for each of the symbols of the encoding of the Brotli Literal command in the binarized format. The mapped value may also be serialized into the further compressed content item for use by the decompressor.

A combination of the two foregoing techniques is also possible for a given Brotli Literal command encoded in the binarized format. In particular, a mapped value may be combined with the two or three previously coded symbols or two or three sets of symbols to select a bin index of a statistical bin. The selected statistical bin may then be used to generate a probability estimate for each symbol of the binarized format that encodes the Brotli Literal command.

In some implementations, selection of a statistical bin for a current symbol of the binarized format to be arithmetically coded is based on a recurrent neural network-based text prediction algorithm. That is, the recurrent neural network-based text prediction algorithm may be used to generate a prediction of the next Brotli command in the baseline format or to generate a prediction of the next portion of a Brotli command (e.g., the next literal) in the baseline format, relative to the current symbol. The prediction may then be used to select a statistical bin for coding the current symbol. Some non-limiting examples of a recurrent neural network-based text prediction algorithm that may be used is a character language-level recurrent neural network. Non-limiting example implementations of a character language-level recurrent neural network that may be used to generate the text prediction for informing statistical bin selection are available in source code form on the Internet at /karpathy/char-rnn and /sherjilozair/char-rnn-tensorflow in the github.com domain.

In some implementations in which the binarized format represents a Brotli compression of the original content item, a recurrent neural network-based text prediction algorithm is used to inform the selection of the word index and/or the word size in the dictionary.

In some implementations in which the binarized format represents a Brotli compression of the original content item, distances of Brotli Copy commands are alternatively selected from a small cache of previously serialized distances according to the Brotli algorithm, plus or minus one or two off of previously used values. In some implementations, previous distances of Brotli Copy commands are serialized directly into the further compress file for use in predicting the copy distance or length.

In some implementations, one of different possible neural network configurations is used to generate the probability estimate directly without statistical bin selection. The configuration may involve a feed forward network, a long term short term or recurrent neural network having dynamic memory that can remember of an arbitrarily sized window, or a neural network where the weights of the network are updated during compression/decompression and starting from a pre-trained model.

Alternative Probability Determination

In some implementations, a recurrent neural network-based text prediction algorithm directly trains on and informs the probability of upcoming nibbles in a literal string of the binarized format. That is, the text prediction made by the recurrent neural network can be used as a prior for selecting a statistical bin.

Alternatively, the text prediction may be trained to seek the most likely dictionary match and to compute the probability estimates directly.

As yet another alternative, the text prediction algorithm may be trained during compression/decompression of the original content item to make a specially tuned custom encoding for the particular file, thereby allowing machine learning to learn to predict the file as it is decompressed. This other alternative may also be combined with statistical bin selection. A pre-trained model that is trained online using current data may also be used.

Dictionary Selection

As mentioned, Brotil compression uses a fixed dictionary that is embedded in the baseline format itself. In some implementations, the compression techniques herein use any of a number of dictionaries (e.g., up to 256 dictionaries) trained on individual file cohorts. The dictionary can be specified on a per-content item basis. Files hosted with a central network file system can be clustered using machine learning with a specific dictionary for each cluster.

For example, a document file may be converted to a word frequency vector (e.g., based on the vector space model). The vector may then be fed into a neural network that generates an address for the document. The address specifies which cluster the document belongs to. Each cluster may have a specific optimized dictionary. For example, technical documents may have one dictionary, Shakespeare sonnets may have another dictionary, and x86 binary file may have yet another dictionary.

Parallelization

In some implementations, the compression and decompression process is parallelized. The original content item is split into N chunks, where N is the number of cores, and each chunk is compressed/decompressed individually and in parallel. A fixed widow adaptive probability may be used to facilitate parallelization. The result of compressing each of the N chucks individually may be spliced together with a length prefixing each chunk.

Basic Implementing Mechanisms

Figure 5:
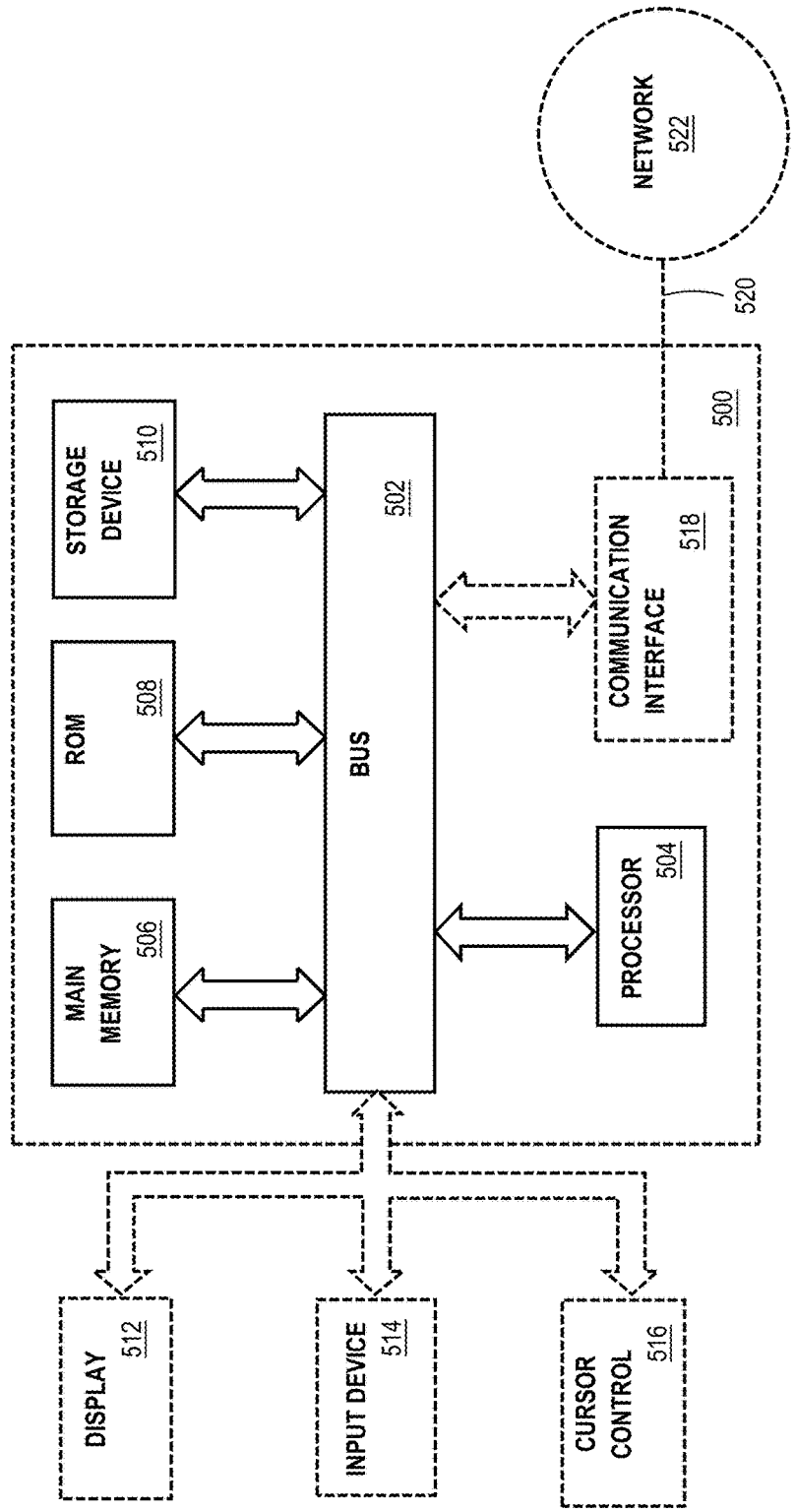
FIG. 5 illustrates an example of a basic hardware machine used in some implementations of the present invention.

Some implementations use a computing system comprising one or more processors and storage media. The one or more processors and memory may be provided by one or more hardware machines. FIG. 5 illustrates an example of a basic hardware machine 500 that is used in some implementations. Hardware machine 500 and its hardware components, including their connections, relationships, and functions, is meant to be exemplary only, and not meant to limit the implementations. Other suitable hardware machines suitable for an implementation may have different components, including components with different connections, relationships, and functions.

Hardware machine 500 includes a bus 502 or other communication mechanism for addressing a main memory 506 and for transferring data between and among the various components of hardware machine 500.

Hardware machine 500 also includes a processor 504 coupled with bus 502 for processing information. Processor 504 may be a general-purpose microprocessor, a system on a chip (SoC), or another hardware processor.

Main memory 506, such as a random-access memory (RAM) or other dynamic storage device, is coupled to bus 502 for storing information and software instructions to be executed by processor 504. Main memory 506 also may be used for storing temporary variables or other intermediate information during execution of software instructions to be executed by processor 504.

Software instructions, when stored in storage media accessible to processor 504, render hardware machine 500 into a special-purpose computing machine that is customized to perform the operations specified in the software instructions. The terms "software", "software instructions", "computer program", "computer-executable instructions", and "processor-executable instructions" are to be broadly construed to cover any machine-readable information, whether or not human-readable, for instructing a machine to perform specific operations, and including, but not limited to, application software, desktop applications, scripts, binaries, operating systems, device drivers, boot loaders, shells, utilities, system software, JAVASCRIPT, web pages, web applications, mobile applications, plugins, embedded software, microcode, compilers, debuggers, interpreters, virtual machines, linkers, and text editors.

Hardware machine 500 includes a read-only memory (ROM) 508 or other static storage device coupled to bus 502 for storing static information and software instructions for a processor 504.

A mass storage device 510 is coupled to bus 502 for persistently storing information and software instructions on fixed or removable media, such as magnetic, optical, solid-state, magnetic-optical, flash memory, or any other available mass storage technology. The mass storage may be shared on a network, or it may be dedicated mass storage. Mass storage device 510 may store a body of program and data for directing operation of hardware machine 500, including an operating system, user application programs, driver, and other support files, as well as other data files of all sorts.

Hardware machine 500 may be coupled via bus 502 to a display 512, such as a liquid crystal display (LCD) or other electronic visual display, for displaying information to a computer user. A touch sensitive surface incorporating touch detection technology (e.g., resistive, capacitive, etc.) may be incorporated with display 512 to form a touch sensitive display for communicating touch gesture (e.g., finger or stylus) input to processor 504.

An input device 514 may be coupled to bus 502 for communicating information and command selections to processor 504. Input device 514 may include alphanumeric and other keys. Input device 514 may include one or more physical buttons or switches such as, for example, a power (on/off) button, a "home" button, volume control buttons, or the like.

A cursor control 516, such as a mouse, a trackball, touchpad, touch-sensitive surface, or cursor direction keys for communicating direction information and command selections to processor 504 and for controlling cursor movement on display 512, may be coupled to bus 502. Cursor control 516 may have two degrees of freedom in two axes, a first axis (e.g., x) and a second axis (e.g., y), that allows the device to specify positions in a plane. Cursor control 516 may have more degrees of freedom with a third axis (e.g., z). For example, cursor control 516 may have three translational degrees of freedom (e.g., surge, heave, and sway) in three perpendicular axes, that allows the device to specify position in the three axes. Cursor control 516 may have three rotational degrees of freedom (e.g., pitch, yaw, roll) about three perpendicular axes, that allows the device to specify an orientation about the three axes.

While one or more of display 512, input device 514, and cursor control 516 may be external components (i.e., peripheral devices) of hardware machine 500, some or all of display 512, input device 514, and cursor control 516 may be integrated as part of the form factor of hardware machine 500.

A function or operation of an implementation may be performed by hardware machine 500 in response to processor 504 executing one or more programs of software instructions contained in main memory 506. Such software instructions may be read into main memory 506 from another storage medium, such as a storage device 510. Execution of the software instructions contained in main memory 506 cause processor 504 to perform the function or operation.

While a function or operation of an implementation may be implemented entirely with software instructions, hard-wired or programmable circuitry of hardware machine 500 (e.g., an ASIC, a FPGA, or the like) may be used in place of or in combination with software instructions to perform the function or operation.

The term "storage media" as used herein refers to any non-transitory media that store data and/or software instructions that cause a hardware machine to operate in a specific fashion. Such storage media may comprise non-volatile media and/or volatile media. Non-volatile media includes, for example, non-volatile random access memory (NVRAM), flash memory, optical disks, magnetic disks, or solid-state drives, such as storage device 510. Volatile media includes dynamic memory, such as main memory 506. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, flash memory, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more software instructions to processor 504 for execution. For example, the software instructions may initially be carried on a magnetic disk or solid-state drive of a remote computer. The remote computer can load the software instructions into its dynamic memory and send the software instructions over a data communications network. Hardware machine 500 can receive the data over the data communications network and appropriate circuitry can place the data on bus 502. Bus 502 carries the data to main memory 506, from which processor 504 retrieves and executes the software instructions. The software instructions received by main memory 506 may optionally be stored on storage device 510 either before or after execution by processor 504.

Hardware machine 500 may include a communication interface 518 coupled to bus 502. Communication interface 518 provides a two-way data communication coupling to a wired or wireless network link 520 that connects hardware machine 500 to a data communications network 522 (e.g., a local area network (LAN), a wide area network (WAN), a wireless local area network (WLAN), a metropolitan area network (MAN), a storage area network (SAN), etc.). Network link 520 provides data communication through network 522 to one or more other networked devices.

Communication interface 518 may send and receive electrical, electromagnetic, or optical signals that carry digital data streams representing various types of information. For example, communication interface 518 may be implemented by a wired network interface card, a wireless network interface card with an integrated radio antenna, or a modem.

Network link 520 may provide a connection through network 522 to a host computer or to data equipment operated by an Internet Service Provider (ISP). The ISP may in turn provide data communication services through the world-wide packet data communication network now commonly referred to as the "Internet". Network 522 and Internet use electrical, electromagnetic or optical signals that carry digital data streams. The signals through the various networks and the signals on network link 520 and through communication interface 518, which carry the digital data to and from hardware machine 500, are example forms of transmission media.

Hardware machine 500 can send messages and receive data, including program code, through network 522, network link 520, and communication interface 518. In the Internet example, a server might transmit a requested code for an application program through Internet, ISP, and network 522 and communication interface 518.

The received code may be executed by processor 504 as it is received, and/or stored in storage device 510, or other non-volatile storage for later execution.

Figure 6:
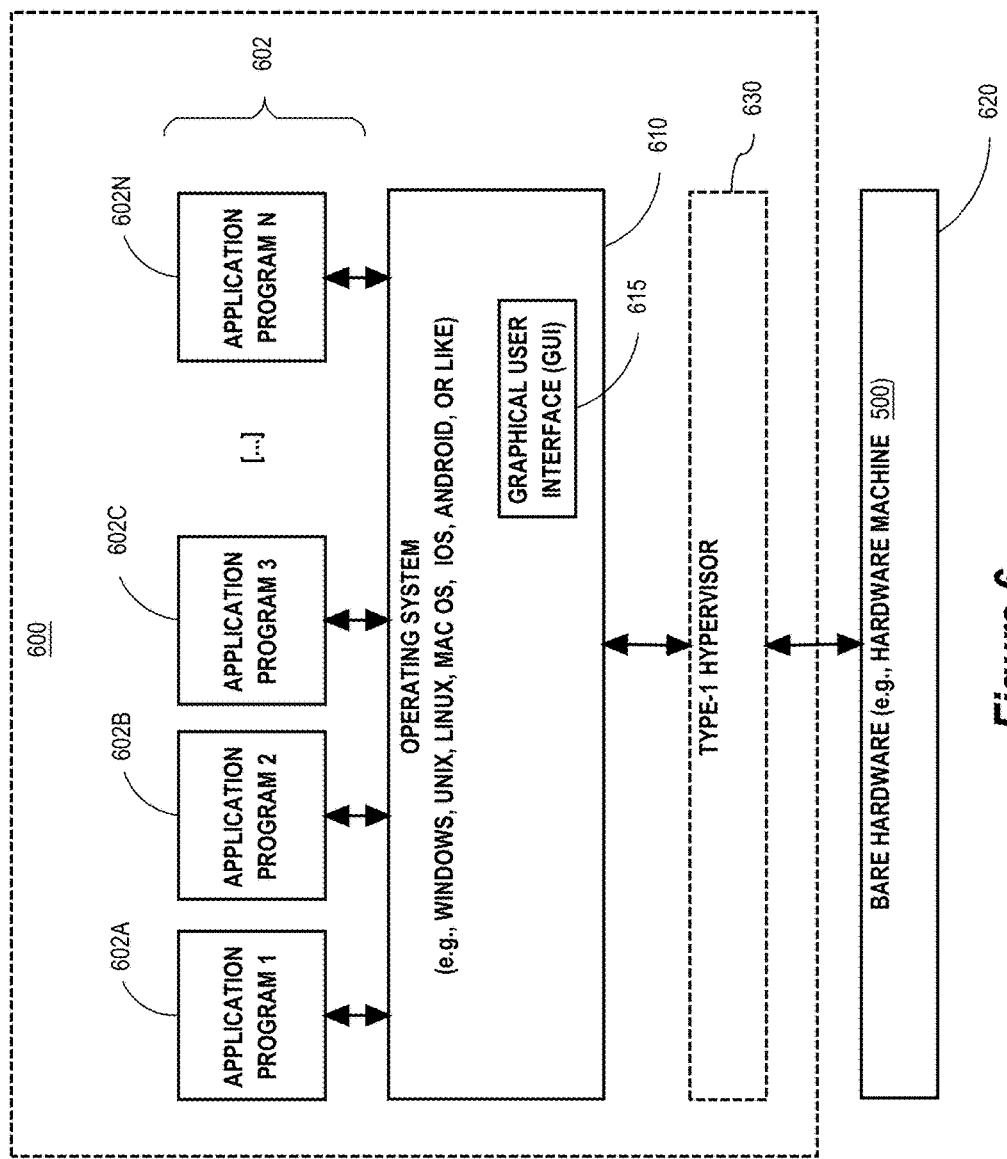
FIG. 6 illustrates an example of a basic software system for controlling the operation of the basic hardware machine in some implementations of the present invention.

FIG. 6 illustrates an example of a basic software system 600 that is employed for controlling the operation of hardware machine 500 of FIG. 5 in an implementation. Software system 600 and its software components, including their connections, relationships, and functions, is meant to be exemplary only, and not meant to limit implementations. Other software systems suitable for an implementation may have different components, including components with different connections, relationships, and functions.

Software system 600 is provided for directing the operation of hardware machine 500. Software system 600 may be stored in system memory (RAM) 506 and on fixed storage (e.g., hard disk or flash memory) 510.

Software system 600 includes a kernel or operating system (OS) 610. OS 610 manages low-level aspects of computer operation, including managing execution of processes, memory allocation, file input and output (I/O), and device I/O.

Software system 600 includes one or more application programs, represented as 602A, 602B, 602C . . . 602N, that may be "loaded" (e.g., transferred from fixed storage 510 into memory 506) for execution by hardware machine 500. The applications or other software intended for use on hardware machine 500 may also be stored as a set of downloadable computer-executable instructions, for example, for downloading and installation from an Internet location (e.g., a Web server, an app store, or other online service).

Software system 600 includes a graphical user interface (GUI) 615, for receiving user commands and data in a graphical (e.g., "point-and-click" or "touch gesture") fashion. These inputs, in turn, may be acted upon by the system 600 in accordance with instructions from operating system 610 and/or application(s) 602. GUI 615 also serves to display the results of operation from the OS 610 and applications 602, whereupon the user may supply additional inputs or terminate the session (e.g., log off).

Software system 600 can execute directly on bare hardware 620 (e.g., machine 500). Alternatively, a "Type-1" hypervisor 630 may be interposed between the bare hardware 620 and OS 610 as part of software system 600. Hypervisor 630 acts as a software "cushion" or virtualization layer between the OS 610 and bare hardware 620. Hypervisor 630 instantiates and runs one or more virtual machine instances. Each virtual machine instance comprises a "guest" operating system, such as OS 610, and one or more applications, such as applications 602, designed to execute on the guest operating system. Hypervisor 630 presents the guest operating systems with a virtual operating platform and manages the execution of the guest operating systems.

Hypervisor 630 may allow a guest operating system to run as if it is running on bare hardware 620 directly. In this case, the guest operating system as configured to execute on bare hardware 620 can also execute on hypervisor 630. In other words, hypervisor 630 may provide full hardware virtualization to the guest operating system. Alternatively, hypervisor 630 may provide para-virtualization to the guest operating system. In this case, the guest operating system is "aware" that it executes on hypervisor 630 and is specially designed or configured to execute on hypervisor 630.

Extensions and Alternatives

Although some of various drawings may illustrate a number of logical stages in a particular order, stages that are not order dependent may be reordered and other stages may be combined or broken out. While some reordering or other groupings may be specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

The foregoing description, for purpose of explanation, has been described regarding specific implementations. However, the illustrative implementations above are not intended to be exhaustive or to limit the scope of the claims to the precise forms disclosed. Many modifications and variations are possible in view of the above teachings. The implementations were chosen to best explain the principles underlying the claims and their practical applications, to thereby enable others skilled in the art to best use the implementations with various modifications as are suited to the uses contemplated.

The invention claimed is:

1. A computer-implemented method, comprising:
using a neural network to train a plurality of symbol prediction models;
wherein each symbol prediction model of the plurality of symbol prediction models is trained based on a corresponding cohort of content items;
selecting a particular symbol prediction model of the plurality of symbol prediction models based on an intrinsic characteristic of a particular content item to be losslessly compressed;
losslessly compressing the particular content item based on a set of symbol predictions generated using the particular symbol prediction model; and
wherein the method is performed by one or more computing devices.

2. The method of claim 1, wherein the intrinsic characteristic is a type of the particular content item.

3. The method of claim 1, wherein the losslessly compressing the particular content item based on symbol predictions generated using the particular symbol prediction model is based on:
compressing the particular content item to a baseline lossless compressed data format;
binarizing the baseline lossless compressed data format to a binarized format; and
arithmetically coding the binarized format based on the set of symbol predictions generated using the particular symbol prediction model.

4. The method of claim 1, wherein the losslessly compressing the particular content item based on symbol predictions generated using the particular symbol prediction model is based on arithmetically coding symbols based on the set of symbol predictions generated using the particular symbol prediction model.

5. The method of claim 1, wherein the neural network is a recurrent neural network.

6. One or more non-transitory computer-readable media storing one or more programs for execution by one or more computing devices, the one or more programs having comprising instructions configured for:
using a neural network to train a plurality of symbol prediction models based on a first plurality of content item cohorts, the first plurality of content item cohorts including a plurality of content items;
compressing each content item in the plurality of content items using each symbol prediction model of the plurality of symbol prediction models; and
using a neural network to train a cohort predictor model based on results of the compressing each content item in the plurality of content items.

7. The one or more non-transitory computer-readable media of claim 6, the instructions further configured for:
after the using a neural network to train the cohort predictor model, using the cohort predictor model to predict a cohort of the first plurality of content item cohorts for each content item in the plurality of content items.

8. The one or more non-transitory computer-readable media of claim 7, the instructions further configured for:
forming a second plurality of content item cohorts based on results of the using the cohort predictor model, the second plurality of content item cohorts including the plurality of content items; and
using a neural network to update the plurality of symbol prediction models based on the second plurality of content item cohorts resulting in a plurality of updated symbol prediction models.

9. The one or more non-transitory computer-readable media of claim 8, the instructions further configured for selecting a particular updated symbol prediction model of the plurality of updated symbol prediction models based on an intrinsic characteristic of a particular content item; and losslessly compressing the particular content item using the particular updated symbol prediction model.

10. The one or more non-transitory computer-readable media of claim 8, the instructions further configured for:
using the cohort predictor model to predict a particular cohort of the second plurality of content item cohorts for a particular content item;
based on results of the using the cohort predictor model to predict the particular cohort for the particular content item, selecting a particular updated symbol prediction model of the plurality of updated symbol prediction models; and
losslessly compressing the particular content item using the particular updated symbol prediction model.

11. The one or more non-transitory computer-readable media of claim 6, wherein the neural network used to train the plurality of symbol prediction models is a recurrent neural network.

12. The one or more non-transitory computer-readable media of claim 6, wherein the neural network used to train the cohort predictor model is a recurrent neural network.

13. A computing system comprising:
one or more processors;
storage media;
one or more programs stored in the storage media for executions by the one or more processors, the one or more programs having instructions configured for:
using a neural network to train a plurality of symbol prediction models;
wherein each symbol prediction model of the plurality of symbol prediction models is trained based on a corresponding cohort of content items;
selecting a particular symbol prediction model of the plurality of symbol prediction models based on an intrinsic characteristic of a particular content item to be losslessly compressed;
losslessly compressing the particular content item based on a set of symbol predictions generated using the particular symbol prediction model; and
using a neural network to train a cohort predictor model based at least in part on results of the losslessly compressing the particular content item.

14. The computing system of claim 13, the instructions further configured for:
after the using a neural network to train the cohort predictor model, using the cohort predictor model to predict a cohort of a first plurality of content item cohorts for each content item in a plurality of content items.

15. The computing system of claim 14, the instructions further configured for:
forming a second plurality of content item cohorts based on results of the using the cohort predictor model, the second plurality of content item cohorts including the plurality of content items; and
using a neural network to update the plurality of symbol prediction models based on the second plurality of content item cohorts resulting in a plurality of updated symbol prediction models.

16. The computing system of claim 15, the instructions further configured for selecting a particular updated symbol prediction model of the plurality of updated symbol prediction models based on an intrinsic characteristic of a particular content item; and losslessly compressing the particular content item using the particular updated symbol prediction model.

17. The computing system of claim 15, the instructions further configured for:
using the cohort predictor model to predict a particular cohort of the second plurality of content item cohorts for a particular content item;
based on results of the using the cohort predictor model to predict the particular cohort for the particular content item, selecting a particular updated symbol prediction model of the plurality of updated symbol prediction models; and
losslessly compressing the particular content item using the particular updated symbol prediction model.

18. The computing system of claim 13, wherein the intrinsic characteristic is a type of the particular content item.

19. The computing system of claim 13, wherein the losslessly compressing the particular content item based on symbol predictions generated using the particular symbol prediction model is based on:
compressing the particular content item to a baseline lossless compressed data format;
binarizing the baseline lossless compressed data format to a binarized format; and
arithmetically coding the binarized format based on the set of symbol predictions generated using the particular symbol prediction model.

20. The computing system of claim 13, wherein the losslessly compressing the particular content item based on symbol predictions generated using the particular symbol prediction model is based on arithmetically coding symbols based on the set of symbol predictions generated using the particular symbol prediction model.

* * * * *